(12) United States Patent
Arthur et al.

(10) Patent No.: US 11,417,759 B2
(45) Date of Patent: Aug. 16, 2022

(54) SEMICONDUCTOR DEVICE AND METHOD FOR REDUCED BIAS THRESHOLD INSTABILITY

(71) Applicant: General Electric Company, Schenectady, NY (US)

(72) Inventors: Stephen Daley Arthur, Glenville, NY (US); Joseph Darryl Michael, Delmar, NY (US); Tammy Lynn Johnson, Ballston Lake, NY (US); David Alan Lilienfeld, Niskayuna, NY (US); Kevin Sean Matocha, Starkville, MS (US); Jody Alan Fronheiser, Delmar, NY (US); William Gregg Hawkins, Rexford, NY (US)

(73) Assignee: General Electric Company, Schenectady, NY (US)

( * ) Notice: Subject to any disclaimer, the term of this patent is extended or adjusted under 35 U.S.C. 154(b) by 579 days.

(21) Appl. No.: 16/433,809

(22) Filed: Jun. 6, 2019

(65) Prior Publication Data
US 2019/0363183 A1 Nov. 28, 2019

Related U.S. Application Data

(63) Continuation of application No. 13/431,596, filed on Mar. 27, 2012, now Pat. No. 10,367,089.
(Continued)

(51) Int. Cl.
*H01L 29/78* (2006.01)
*H01L 21/04* (2006.01)
(Continued)

(52) U.S. Cl.
CPC ............ *H01L 29/78* (2013.01); *H01L 21/045* (2013.01); *H01L 29/45* (2013.01);
(Continued)

(58) Field of Classification Search
CPC ... H01L 29/78; H01L 21/045; H01L 29/7802; H01L 29/1608; H01L 29/45;
(Continued)

(56) References Cited

U.S. PATENT DOCUMENTS

| | | | |
|---|---|---|---|
| 4,990,994 A | 2/1991 | Furukawa et al. |
| 5,124,779 A | 6/1992 | Furukawa et al. |

(Continued)

FOREIGN PATENT DOCUMENTS

| | | |
|---|---|---|
| CN | 1449034 A | 10/2003 |
| CN | 1906767 A | 1/2007 |

(Continued)

OTHER PUBLICATIONS

Nakatsuka et. al., "Low Resistance TiAl Ohmic Contacts with Multi-Layered Structure for p-Type 4H-SiC", Materials Transactions, vol. 43, No. 7 (2002) pp. 1684 to 1688.
(Continued)

*Primary Examiner* — Patricia D Valenzuela
(74) *Attorney, Agent, or Firm* — Fitch, Even, Tabin & Flannery LLP

(57) ABSTRACT

According to one embodiment, a semiconductor device, having a semiconductor substrate comprising silicon carbide with a gate electrode disposed on a portion of the substrate on a first surface with, a drain electrode disposed on a second surface of the substrate. There is a dielectric layer disposed on the gate electrode and a remedial layer disposed about the dielectric layer, wherein the remedial layer is configured to mitigate negative bias temperature instability maintaining a change in threshold voltage of less than about 1 volt. A source electrode is disposed on the remedial layer, wherein the source electrode is electrically coupled to a contact region of the semiconductor substrate.

18 Claims, 8 Drawing Sheets

Related U.S. Application Data

(60) Provisional application No. 61/468,294, filed on Mar. 28, 2011, provisional application No. 61/468,327, filed on Mar. 28, 2011, provisional application No. 61/468,348, filed on Mar. 28, 2011, provisional application No. 61/468,367, filed on Mar. 28, 2011.

(51) Int. Cl.
*H01L 29/45* (2006.01)
*H01L 29/16* (2006.01)
*H01L 29/49* (2006.01)
*H01L 29/739* (2006.01)
*H01L 29/745* (2006.01)
*H01L 23/04* (2006.01)
*H01L 21/50* (2006.01)

(52) U.S. Cl.
CPC .......... *H01L 29/7802* (2013.01); *H01L 21/50* (2013.01); *H01L 23/04* (2013.01); *H01L 29/1608* (2013.01); *H01L 29/4925* (2013.01); *H01L 29/4933* (2013.01); *H01L 29/7395* (2013.01); *H01L 29/7455* (2013.01)

(58) Field of Classification Search
CPC ............. H01L 29/4925; H01L 29/4933; H01L 29/7395; H01L 29/7455; H01L 21/50; H01L 23/04
See application file for complete search history.

(56) References Cited

U.S. PATENT DOCUMENTS

| | | | |
|---|---|---|---|
| 5,385,855 A | 1/1995 | Brown et al. | |
| 6,025,254 A | 2/2000 | Doyle et al. | |
| 6,169,304 B1 | 1/2001 | Arita et al. | |
| 6,344,663 B1 | 2/2002 | Slater, Jr. et al. | |
| 6,686,616 B1* | 2/2004 | Allen | H01L 29/47 257/280 |
| 6,833,562 B2 | 12/2004 | Tanimoto et al. | |
| 6,886,105 B2 | 4/2005 | Kahn et al. | |
| 7,030,498 B2 | 4/2006 | Kakamu et al. | |
| 7,242,055 B2 | 7/2007 | Bojarczuk, Jr. et al. | |
| 7,256,087 B1 | 8/2007 | Sadoughi et al. | |
| 7,622,741 B2 | 11/2009 | Miura | |
| 7,629,653 B1 | 12/2009 | Sadoughi et al. | |
| 7,732,301 B1* | 6/2010 | Pinnington | H01L 21/2654 438/455 |
| 8,035,112 B1 | 10/2011 | Cooper et al. | |
| 9,257,283 B2 | 2/2016 | Michael et al. | |
| 9,576,868 B2 | 2/2017 | Michael et al. | |
| 2003/0034550 A1* | 2/2003 | Nakatani | H01L 24/03 257/643 |
| 2003/0107041 A1 | 6/2003 | Tanimoto et al. | |
| 2003/0183895 A1* | 10/2003 | Okamura | H01L 29/66143 257/454 |
| 2004/0145001 A1 | 7/2004 | Kanda et al. | |
| 2004/0214453 A1* | 10/2004 | Endou | H01L 29/7828 438/149 |
| 2006/0214198 A1 | 9/2006 | Matsuki et al. | |
| 2007/0066039 A1* | 3/2007 | Agarwal | H01L 29/6606 438/534 |
| 2007/0181951 A1 | 8/2007 | Chen et al. | |
| 2007/0235810 A1 | 10/2007 | Delgado et al. | |
| 2008/0099796 A1* | 5/2008 | Vora | H01L 21/823878 257/256 |
| 2008/0102591 A1* | 5/2008 | Nakamura | H01L 29/7828 438/308 |
| 2008/0157291 A1 | 7/2008 | Li et al. | |
| 2008/0296771 A1* | 12/2008 | Das | H01L 23/4827 257/758 |
| 2008/0303081 A1 | 12/2008 | Hshieh | |
| 2008/0315211 A1* | 12/2008 | Ichikawa | H01L 29/7828 257/77 |
| 2009/0047780 A1 | 2/2009 | Huang et al. | |
| 2009/0090920 A1* | 4/2009 | Endo | H01L 29/7802 257/77 |
| 2009/0242901 A1 | 10/2009 | Matocha et al. | |
| 2009/0280614 A1 | 11/2009 | Chen et al. | |
| 2009/0321746 A1* | 12/2009 | Harada | H01L 21/0485 257/77 |
| 2010/0193796 A1 | 8/2010 | Nakano | |
| 2010/0224939 A1 | 9/2010 | Kim et al. | |
| 2011/0018005 A1 | 1/2011 | Nakano | |
| 2011/0024765 A1 | 2/2011 | Losee et al. | |
| 2011/0284876 A1 | 11/2011 | Okamura et al. | |
| 2012/0012861 A1 | 1/2012 | Nakano et al. | |
| 2012/0049202 A1 | 3/2012 | Nakano | |

FOREIGN PATENT DOCUMENTS

| | | |
|---|---|---|
| JP | 10256529 A | 9/1998 |
| JP | 2010272785 A | 12/2010 |
| WO | 2010143376 A1 | 12/2010 |

OTHER PUBLICATIONS

Young et al., "Electron Trapping in SiO2 at 295 and 77° K", Journal of Applied Physics, vol. No. 50, Issue No. 10, pp. 6366-6372, 1979.

Aitken et al., "Electron-Beam Lithography Damage and Contact Metallurgy in 1 μm MOSFET Technology", IEEE Electron Devices Meeting, Washington, DC, USA, pp. 50-53, Dec. 1981.

Lee et al., "A Simple and Accurate Method to Measure the Threshold Voltage of an Enhancement-Mode MOSFET", IEEE Transactions on Electron Devices, vol. No. 29, Issue No. 02, pp. 346-348, Feb. 1982.

Lai, "Effect of Gate Metals on Interface Effects in Metal Oxide Semiconductor Systems After Electron Trapping", Journal of Applied Physics, vol. No. 53, Issue No. 10, pp. 7104-7105, 1982.

Suni et al., "Performance of Titanium Nitride Diffusion Barriers in Aluminum-Titanium Metallization Schemes for Integrated Circuits", Journal of Vacuum Science & Technology A, vol. No. 3, Issue No. 6, pp. 2233-2236, 1985.

Marwick et al., "Hydrogen Redistribution and Gettering in AlCu/Ti Thin Films", Journal of Applied Physics, vol. No. 69 Issue No. 11, pp. 7921-7923, Jun. 1991.

Yamaha et al., "Influence of Retarding Hydrogen Diffusion in Boron Phosphosilicate Glass on Annealing Damage of Metal-Oxide Semiconductor Transistors", Journal of the Electrochemical Society, vol. No. 146 Issue No. 8, pp. 3065-3069, 1999.

Lelis et al., "Effect of Threshold-Volatage Instability on SiC DMOSFET Reliability", IEEE International Integrated Reliability Workshop Final Report, S. Lake Tahoe, pp. 72-76, Oct. 12-16, 2008.

Grasser et al., "Understanding Negative Bias Temperature Instability in the Context of Hole Trapping", Microelectronic Engineering, vol. No 86, Issue No. 7-9, pp. 1876-1882, 2009.

Rozen et al., "Density of Interface States, Electron Taps, and Hole Traps as a Function of the Nitrogen Density in SiO2 on SiC", Journal of Applied Physics, vol. No. 105, Issue No. 12, pp. 1-12, 2009.

Shen et al., "Atomic-Scale Origins of Bias-Temperature Instabilities in SiC-SiO2 Structures", Applied Physics Letters, vol. No. 98, Issue No. 6, pp. 1-4, 2011.

Unofficial English Translation of Japanese Office Action issued in connection with corresponding JP Application No. 2014502732 dated Feb. 9, 2016.

Chinese Office Action issued in connection with corresponding CN Application No. 201280015829.8 dated Feb. 22, 2016.

X. Zhou, K.Y. Lim, and D. Lim, "A Simple and Unambiguous Definition of Threshold Voltage and Its Implications in Deep-Submicron MOS Device Modeling", IEEE Transactions on Electron Devices, vol. 46, No. 4, Apr. 1999, pp. 807-809.

Schroder et al, "Negative bias temperature instability: Road to cross in deep submicron silicon semiconductor manufacturing", Journal of Applied Physics vol. 94, No. 1, Jul. 1, 2003, pp. 1-18.

Wondrak et al., "SiC devices for advanced power and high-temperature applications", vol. 48, No. 2, pp. 307-308, Apr. 1, 2001.

(56) References Cited

OTHER PUBLICATIONS

Gurfinkel et al., "Ultra-Fast Characterization of Transient Gate Oxide Trapping in SiC Mosfets", pp. 462-466, Apr. 1, 2007.

Okayama et al., "Bias-stress induced threshold voltage and drain current instability in 4H-SiC DMOSFETs", vol. 52, No. 1, pp. 164-170, Nov. 23, 2007.

Lelis et al., "Time Dependence of Bias-Stress-Induced SiC MOSFET Threshold-Voltage Instability Measurements", vol. 55, No. 8, pp. 1835-1840, Aug. 1, 2008.

Campbell et al., Atomic-Scale Defects Involved in the Negative-Bias Temperature Instability, IEEE Transactions on Device and Materials Reliability, vol. 7, No. 4, pp. 540-557, Dec. 2007.

Schroder, Bias Temperature Instability in Silicon Carbide, ISDRS 2009, http://www.ece.umd.edu/ISDRS2009, 2 pages, Dec. 9-11, 2009.

Grasser et al., "A Two-State Model for Negative Bias Temperature Instability", IEEE CFP09RPS-CDR 47th Annual International Reliability Physics Symposium, Montreal, pp. 33-44, 2009.

Cheng et al., "High-Temperature Reliability of 4H-SiC Vertical-Channel Junction Field-Effect Transistors (VJFETs) for Power Conditioning System Applications", 5 pages.

Negoro et al., High-Voltage 4H-SiC p-Diodes Fabricated by p-Type Ion Implantation, Electronics and Communications in Japan, Part 2, vol. 86, No. 12, pp. 44-51, 2003.

Cheng et al., "High-Temperature Reliability Assessment of 4H-SiC Vertical-Channel JFET Including Forward Bias Stress", 4 pages.

Mahapatra et al., "Negative Bias Temperature Instability Basics/Modeling", 47 pages.

Marinella et al., "Evidence of Negative Bias Temperature Instability in 4H-SiC Metal Oxide Semiconductor Capacitors", Applied Physics Letters, vol. 90, pp. 253508-1to253508-3, 2007.

Tsetseris et al., "Physical Mechanisms of Negative-Bias Temperature Instability", Applied Physics Letters, vol. 86, pp. 142103-1to142103-3, 2005.

Chante et al., Silicon Carbide Power Devices, IEEEE, pp. 125-134, 1998.

Li et al., "The Role of Hydrogen in Negative Bias Temperature Instability of pMOSFET", Chinese Physics, vol. 15, No. 4, pp. 833-838, Apr. 2006.

Gurfinkel et al., Ultra-Fast Measurements of Vth Instability in SiC MOSFETs Due to Positive and Negative Constant Bias Stress, IEEE, pp. 49-53, 2006.

\* cited by examiner

SEMICONDUCTOR DEVICE AND METHOD FOR REDUCED BIAS THRESHOLD INSTABILITY

CROSS REFERENCE TO RELATED APPLICATIONS

This application is a continuation of U.S. patent application Ser. No. 13/431,596, entitled "Semiconductor Device and Method for Reduced Bias Threshold Instability," filed Mar. 27, 2012, which claims benefit and priority to U.S. provisional application Ser. No. 61/468,294, filed Mar. 28, 2011, U.S. Provisional Application No. 61/468,327, filed Mar. 28, 2011, U.S. Provisional Application No. 61/468,348, filed Mar. 28, 2011, and U.S. Provisional Application No. 61/468,367, filed Mar. 28, 2011, all of which are incorporated by reference in their entirety for all purposes.

BACKGROUND

Bias Temperature Instability (BTI) refers to the phenomenon that occurs with respect to certain semiconductor devices and is considered one of the most critical elements for reliability. It is particularly noticeable under conditions of a negative bias, elevated temperatures, and long term operation. In the silicon (Si) semiconductor field, this long-standing BTI problem has manifested itself for many years and there has been considerable research and multiple designs to mitigate the problem in Si devices. In the fast-growing silicon carbide (SiC) field, the bias temperature instability is generating major concerns for reliability, performance limitations, and product qualification. For example, a strong Negative Bias Temperature Instability (NBTI) has been observed in SiC devices, resulting in a significant decrease in the absolute threshold voltage, to the point that a normally-off device becomes normally-on (conductive with gate-source voltage at zero volts). The NBTI problem has been documented, however there has yet to be an industry solution.

While the BTI issue has been alleviated in many instances in the Si device marketplace or is less of an impact for Si, there are significant behavioral differences between Si and SiC devices such that the mechanisms used to alleviate the problem in Si do not readily translate to SiC.

While the SiC community is yet to reach a consensus about the root cause of the NBTI problem, it is generally attributed to the existence of interface traps and oxide charges, and can be induced by operating devices at high temperature, and under a bias condition for extended periods. Regardless of the cause of BTI, the effect is clearly demonstrable. As an example, for metal-oxide semiconductor (MOS) devices that operate with a negative bias applied on the gate-to-source, the effects of NBTI are evident by a decrease in the threshold voltage. The threshold voltage instability is more noticeable when a device is under a negative bias and subject to elevated temperatures. As a further example, metal-oxide-semiconductor field effect transistors (MOSFETs) including silicon carbide MOSFETs, experience a shift in the threshold voltage when subjected to combined voltage and temperature stressing. Thus, threshold voltage shift and NBTI have raised reliability concerns, hampering the product adoption, especially the introduction and exploitation of SiC devices into new market applications where SiC devices have unique operating characteristics, can operate at higher temperatures, and enable novel applications.

SUMMARY

One embodiment is a semiconductor device, having a semiconductor substrate comprising silicon carbide with a first surface and a second surface. There is a gate electrode disposed on a portion of the first surface of the substrate and a drain electrode disposed on the second surface of the substrate, with a dielectric layer disposed on the gate electrode, thereby covering the gate electrode. There is a remedial layer disposed about the dielectric layer, wherein the remedial layer is configured to mitigate negative bias temperature instability such that a change in threshold voltage is less than about 1 volt. In one example the change in threshold voltage occurs under a gate to source voltage bias and when a drain current is about 10 microamps with a VDS=0.1 V. A source electrode is disposed on the remedial layer, wherein the source electrode (such as aluminum, copper, and compositions thereof) is electrically coupled to a contact region of the semiconductor substrate. The device can be designed as a metal-oxide semiconductor field-effect transistor (MOSFET), insulated gate bipolar transistors (IGBT), MOS controlled thyristor, and gate controlled thyristor.

In one example, the remedial layer comprises titanium. In another example the remedial layer comprises at least one of indium (In), nickel (Ni), molybdenum (Mo), tungsten (W), gold (Au), copper (Cu), tantalum (Ta), platinum (Pt), and compositions thereof. Also, adhesion layer may be used between the remedial layer and the dielectric layer. The remedial layer is typically configured to provide continuous conformal coverage of the dielectric layer.

In certain applications, the remedial layer comprises a conductive metal and provides continuous conformal coverage of the dielectric layer and serves as a conductor between the contact region and the source electrode. The device can further comprise a contact layer on the first surface of the substrate covering a portion of the contact region, wherein the remedial layer extends to cover at least a portion of the contact layer and serves as a conductor between the contact layer and the source electrode.

In another example where the remedial layer is not intended to serve as a conductor for the contact region, the remedial layer comprises at least one of silicon dioxide ($SiO_2$), silicon nitride ($SiN_x$), and polysilicon.

The remedial layer can have a thickness of less than about 300 nm, and in some cases less than about 20 nm.

While the device operates under normal temperature ranges, the device is further configured to operate at higher temperatures and maintain the VTH. For example, the device operates at a temperature above 125 degrees Celsius, above 175 degrees Celsius, and even operates at a temperature above 300 degrees Celsius.

The gate electrode can comprise a polycrystalline silicon layer and a low resistance layer. There may also be an insulation layer, also called a gate oxide layer, between the gate electrode and the first surface of the substrate, wherein the insulation layer can be silicon dioxide. In one example the low resistance layer comprises at least one of a metal and a silicide.

According to one embodiment, a metal-oxide semiconductor field-effect transistor (MOSFET) device includes a gate electrode with a substrate comprising silicon carbide and having a surface that supports the gate electrode and defines a surface normal direction. The substrate has a drift region including a first dopant type so as to have a first conductivity type, a well region adjacent to the drift region and proximal to the surface, wherein the well region includes a second dopant type so as to have a second conductivity type, and wherein the well region includes a channel region disposed proximal to the gate electrode. There is a source contact region adjacent to the well region, and the source contact region has the first conductivity type. An inter-layer dielectric is disposed about the gate electrode and on a portion of the surface of the substrate having a contact layer disposed on a portion of the surface of the substrate covering a portion of the source contact region. There is a remedial layer disposed over the inter-layer dielectric and in contact with a portion of the surface of the substrate, wherein the remedial layer provides a continuous conformal coverage of the inter-layer dielectric. A source electrode is disposed over the remedial layer and in electrical contact with the source contact region.

In one example the device further comprises a body contact region of the second conductivity type adjacent to the source contact region within the substrate, wherein the contact layer substantially covers the body contact region and a portion of the source contact region, and wherein the source electrode is in electrical contact with the body contact region.

Yet another embodiment is a semiconductor device having a gate electrode with a substrate comprising silicon carbide and defining a major surface that supports the gate electrode and defines a surface normal direction. A gate insulation layer is disposed on a portion of the major surface of the substrate between the substrate and the gate electrode, and a dielectric layer is disposed over the gate electrode and onto an adjacent portion of the major surface of the substrate. There is a contact layer disposed over a portion of the major surface of the substrate. A remedial layer is disposed over the dielectric layer and onto a portion of the major surface of the substrate. A second electrode extends over the remedial layer, wherein the second electrode is in electrical contact with the contact layer. In one example at least a portion of the remedial layer is disposed between the second electrode and the contact layer.

In one example the semiconductor device is selected from the group consisting of a vertical metal-oxide semiconductor field-effect transistor (MOSFET), a lateral MOSFET, an insulated gate bipolar transistors (IGBT), a MOS controlled thyristor, and a gate controlled thyristor.

These and other aspects, features, and advantages of this disclosure will become apparent from the following detailed description of the various aspects of the disclosure taken in conjunction with the accompanying drawings.

DRAWINGS

Embodiments described herein will become better understood when the following detailed description is read with reference to the accompanying drawings in which like characters represent like parts throughout the drawings, wherein.

DETAILED DESCRIPTION

Figure 1:
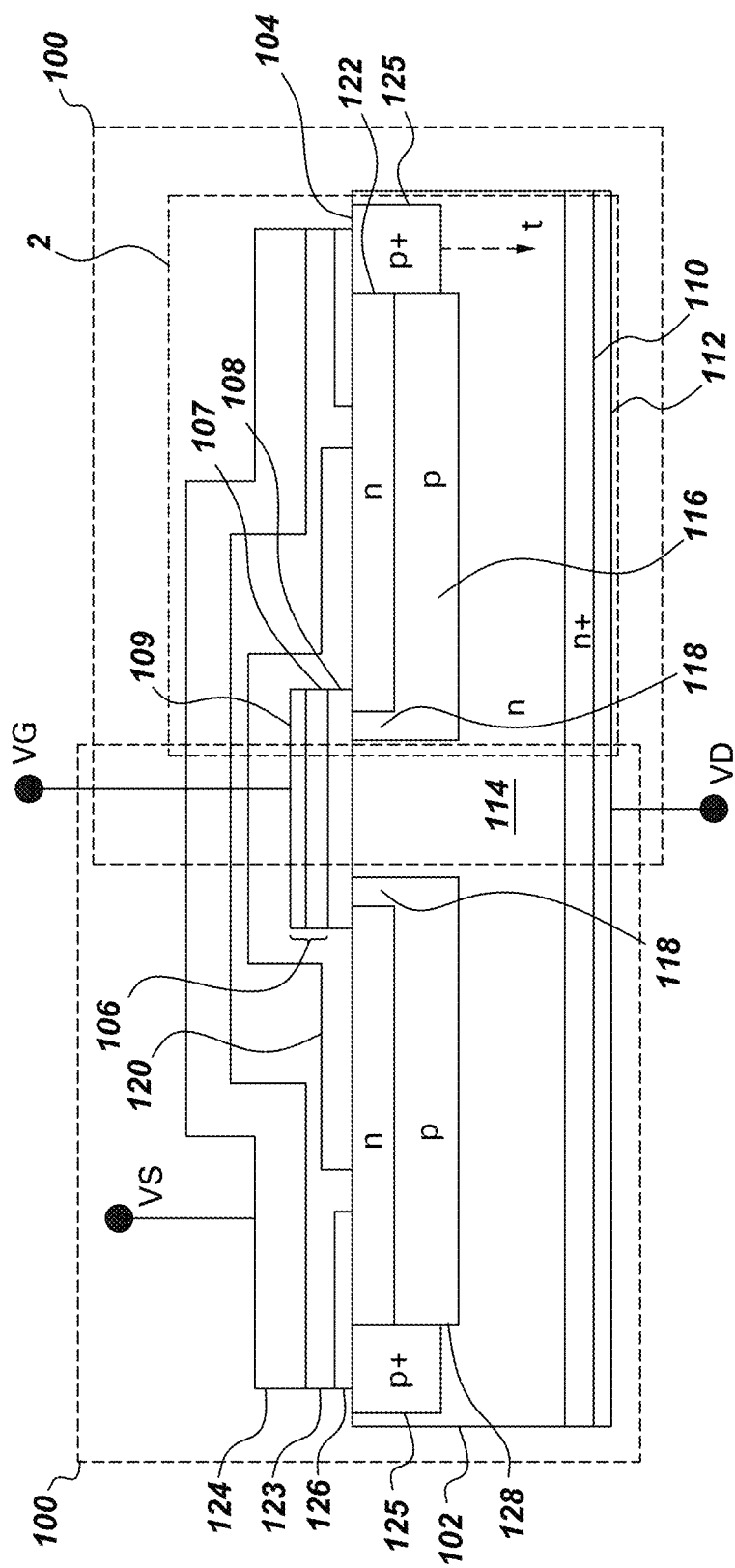
FIG. 1 is a schematic cross-sectional view of a MOSFET configured in accordance with an example embodiment.

Example embodiments are described below in detail with reference to the accompanying drawings, where the same reference numerals denote the same parts throughout the drawings. Some of these embodiments may address the above and other needs. While many of the experiments have been conducted using SiC MOSFETs, the solutions and techniques detailed herein for mitigating NBTI may have applicability to other semiconductor devices such as insulated gate bipolar transistors (IGBT), MOS controlled thyristor, and gate controlled thyristor. For explanatory purposes, the MOS Controlled thyristor (MCT) has two MOSFETs built into the structure and is sensitive to a threshold voltage (VTH) as further defined herein. It is also contemplated that the techniques detailed herein will also mitigate the effects related to positive bias threshold instability (PBTI) which refers to the VTH effects that occur under a positive bias.

Referring to FIG. 1, therein is shown a device, such as a metal-oxide semiconductor field effect transistor (MOSFET) 100, configured in accordance with an example embodiment. The MOSFET 100 can include a substrate 102 that includes semiconductor material, such as, for example, silicon carbide (SiC). The substrate 102 may be a semiconductor die or wafer that defines a major surface 104 and a surface normal direction or "thickness direction" t that extends normally from the surface and into the substrate, as well as directions transverse to the thickness direction (parallel to the local surface).

The surface 104 can support a gate electrode 106. For example, the gate electrode 106 may be disposed on an insulation layer 108 that is in direct contact with the surface 104, such that the insulation layer 108 is disposed between the gate electrode and the substrate 102. In one example the insulation layer 108 extends along the surface 104 and can extend to any point up to the contact layer 126. The gate electrode 106 may include a polycrystalline silicon layer 107, and may also include a low resistance layer 109 formed, for example, of electrically conductive material (e.g., metal and/or silicide). In one example silicide is used as the gate electrode layer. The gate electrode 106 may be configured to receive a gate voltage VG. The insulation layer 108 also sometimes referred to as a gate oxide or gate dielectric may include electrically insulating material, such as silicon dioxide ($SiO_2$).

The substrate 102 can also define a second surface 110 that is in contact with a drain electrode 112, which drain electrode can be configured to receive a drain voltage VD.

It is noted that FIG. 1 is a schematic cross-sectional view of a single MOSFET cell. The full MOSFET device is typically comprised of large number of cells that are situated next to one another and share a common gate electrode 106 and drain electrode 112.

The substrate 102 can include a drift region 114 and, adjacent thereto and proximal to the surface 104, a well region 116. The drift region 114 can be doped with a first dopant type so as to have a first conductivity type with first majority charge carriers and the well region 116 can be doped with a second dopant type so as to have a second conductivity type with second majority charge carriers. For example, the first and second majority charge carriers can be electrons and holes, respectively, such that the respective first and second conductivity types are n-type and p-type, as shown in FIG. 1; where the substrate is formed of SiC, the first dopant type can be, for example, one or more of nitrogen and phosphorus ("n-type dopants"), and the second dopant type can be, for example, one or more of aluminum, boron, gallium, and beryllium ("p-type dopants").

The substrate 102 can further include a source contact region 122 that has the first conductivity type (n-type in the figure). The well region 116 can be disposed proximal to the contact region 122 such that the well region 116 can include therein a channel region 118 disposed proximal to the gate electrode 106. For example, the channel region 118 may extend along the surface 104 under the gate electrode 106 (where "under" means further along the thickness direction t). In one embodiment, the source contact region first conductivity type 122 is disposed adjacent to the surface 104 and the well region 116 surrounds the contact region. The substrate 102 in one example also includes a body contact region 125 that has the second conductivity type (shown as p-type in FIG. 1). The body contact region 125 in this embodiment is disposed adjacent to the well region 116 and to the surface 104.

A dielectric layer 120, sometimes referred to as an inter-layer dielectric (ILD), covers the gate electrode 106 and the insulation layer 108. In one example the dielectric layer is a material comprising phosphorous silicate glass (PSG). In this embodiment a remedial layer 123 covers the dielectric layer 120. As depicted in this example, the remedial layer 123 is disposed on a portion of the substrate surface and extends over a portion or all of the contact layer 126. The source electrode can be configured to receive a voltage source (VS).

A source electrode 124 (e.g., formed of metal, such as aluminum) can be disposed over the remedial layer 123 and in electrical contact with both the source contact region 122 and the body contact region 125 (e.g., through a contact layer 126 that may be formed, for example, of nickel), and the source electrode can be configured to receive a source voltage VS. In some embodiments, the remedial layer 123 is conductive (e.g., formed of a conductive metal) and in contact with at least a portion of the contact region 122 so as to electrically connect the source electrode 124 and the contact region.

Figure 2A:
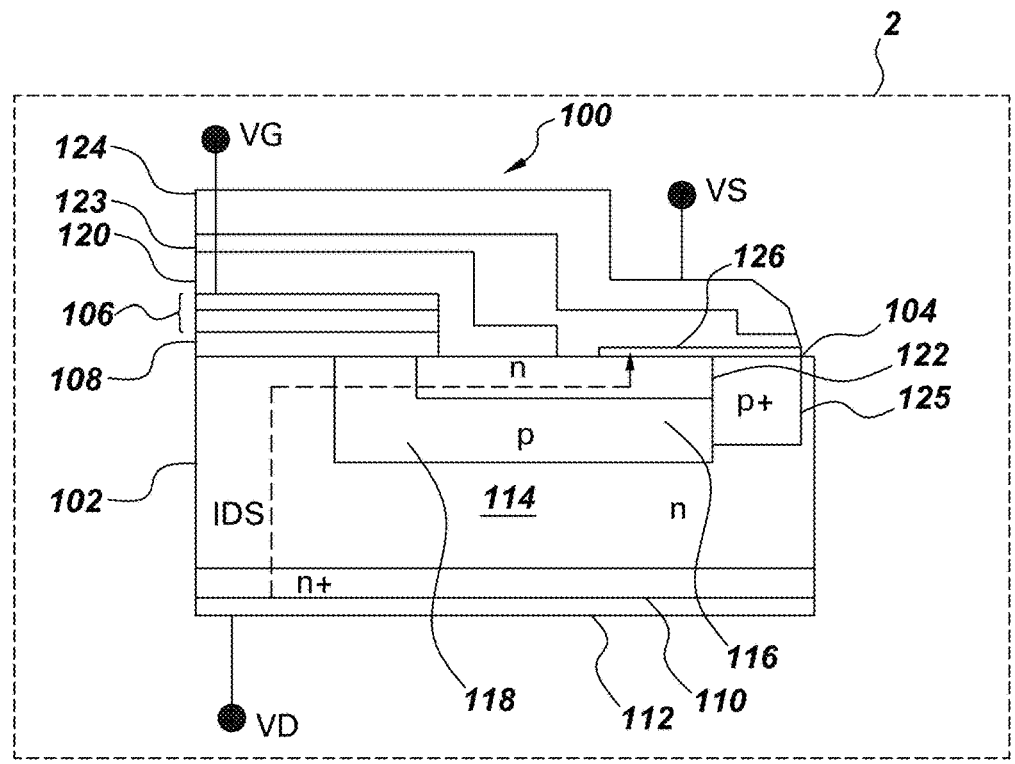
FIG. 2a is a schematic cross-sectional view of the area labeled "2" of the MOSFET of FIG. 1, illustrating a current path through the MOSFET.

Referring to FIG. 2a, the remedial layer 123 contacts a portion of the substrate surface and covers at least some portion of the contact region of the first conductivity 122, while in another example the remedial layer 123 covers at least a portion the contact region of the first conductivity type 122 up to the contact layer 126. While in another embodiment the remedial layer covers at least a portion of the contact region and at least a portion of the contact layer 126.

In operation, the MOSFET 100 in one embodiment acts as a switch. When a voltage difference VDS=VD−VS is applied between the drain electrode 112 and the source electrode 124, an output current (IDS) between those same electrodes can be modulated or otherwise controlled by an input voltage VGS applied to the gate electrode 106, wherein VGS=VG−VS. For gate voltages VG less than a "threshold voltage" (VTH) of the MOSFET 100, the current IDS remains nominally at about zero (a relatively small leakage current may exist even for gate voltages below the threshold voltage). The threshold voltage VTH is a function of, amongst other things, the dimensions, materials, and doping levels in the MOSFET 100, and MOSFETs are typically designed so as to exhibit a predetermined threshold voltage. Circuits including the MOSFET 100 can then be designed to the expected (predetermined) threshold voltage.

Conventional MOSFETs including silicon or SiC have been found to experience a shift in the threshold voltage when subjected to a potential difference between the gate and source electrodes 106, 124 and particularly at elevated temperatures and for extended periods of time. In particular, the negative bias temperature instability (NBTI) has been a significant problem.

Figure 2B:
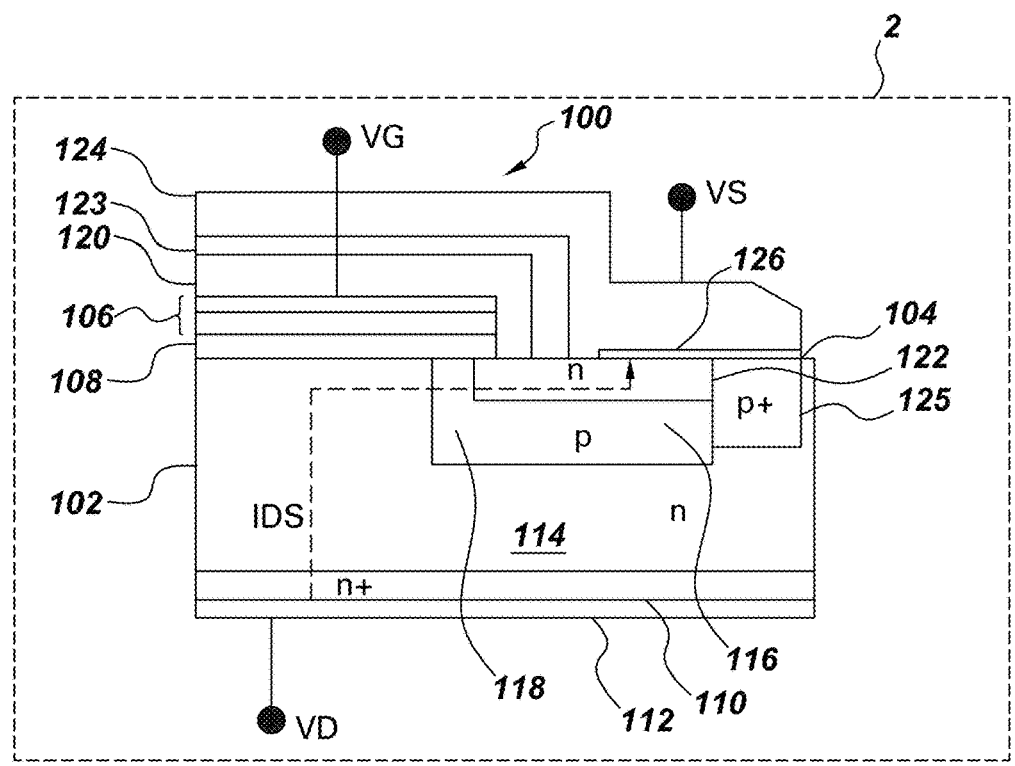
FIG. 2b is a schematic cross-sectional view of the area labeled "2" of the MOSFET of FIG. 1, illustrating another embodiment of the MOSFET.

In FIG. 2b, the device is similar to the structure of FIG. 2a, except the remedial layer 123 does not extend to cover the contact layer 126. Rather, the remedial layer 123 is configured to provide continuous conformal coverage of the inter-layer dielectric (ILD) 120 and in contact with a portion of the substrate. As the remedial layer 123 does not cover the contact layer 126, the remedial layer is not required to be a conductive material.

Figure 3:
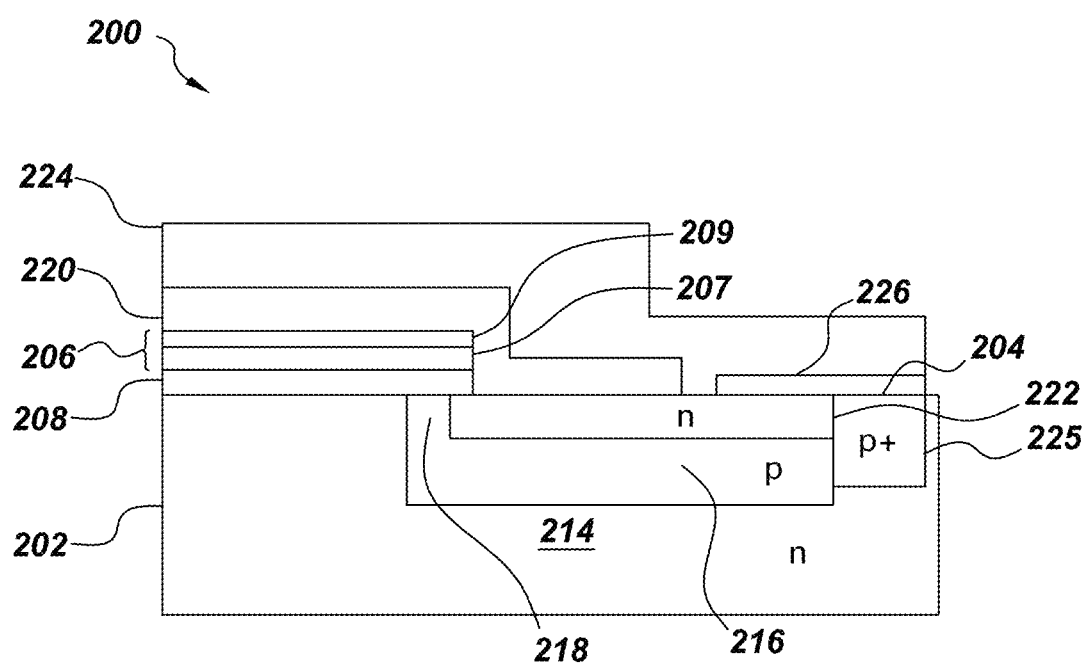
FIG. 3 is a schematic cross-sectional view of a conventional MOSFET.

Referring to FIG. 3, therein is shown a conventional MOSFET 200. The conventional MOSFET 200 does not include an equivalent remedial layer between the source electrode 224 and the dielectric layer 220. The MOSFET 200 can include a substrate 202 that includes semiconductor material (e.g., SiC) and defines a major surface 204 and a surface normal direction or "thickness direction" t. The surface 204 can support an insulation layer 208 (e.g., SiO$_2$), with a gate electrode 206, including a polycrystalline silicon layer 207 and possibly a low resistance layer 209, disposed on the insulation layer.

The substrate 202 can include a drift region 214 and, adjacent thereto and proximal to the surface 204, a well region 216. The drift region 214 can be doped to have a first conductivity type (e.g., n-type) and the well region 216 can be doped so as to have a second conductivity type (e.g., p-type). The substrate 202 can further include a contact region 222 that has the first conductivity type (n-type in the figure). The well region 216 can be disposed adjacent to the contact region 222 such that the well region 216 can include therein a channel region 218 extending under the gate electrode 206. The substrate 202 can also include a body contact region 225 that has the second conductivity type (p-type in the figure), the body contact region being disposed adjacent to the well region 216 and to the surface 204. A dielectric layer 220 (e.g., PSG) may cover the gate electrode 206 and the insulation layer 208. A source electrode 224 can be disposed in contact with both the contact region 222 and the body contact region 225 (through, say, a contact layer 226), and a source voltage VS can be applied thereto.

The threshold voltage (VTH) for a MOSFET is "a voltage not uniquely defined", according to a common reference for device characterization techniques; Semiconductor Material and Device Characterization 2$^{nd}$ edition, Dieter K. Schroder, 1998, John Wiley & Sons. There are at least five different techniques for measuring VTH, and for a specific example, they do not produce exactly the same results. The method employed herein is referred to as the "threshold drain current method", wherein the gate voltage at a specified drain current is taken to be the threshold voltage.

Figure 4:
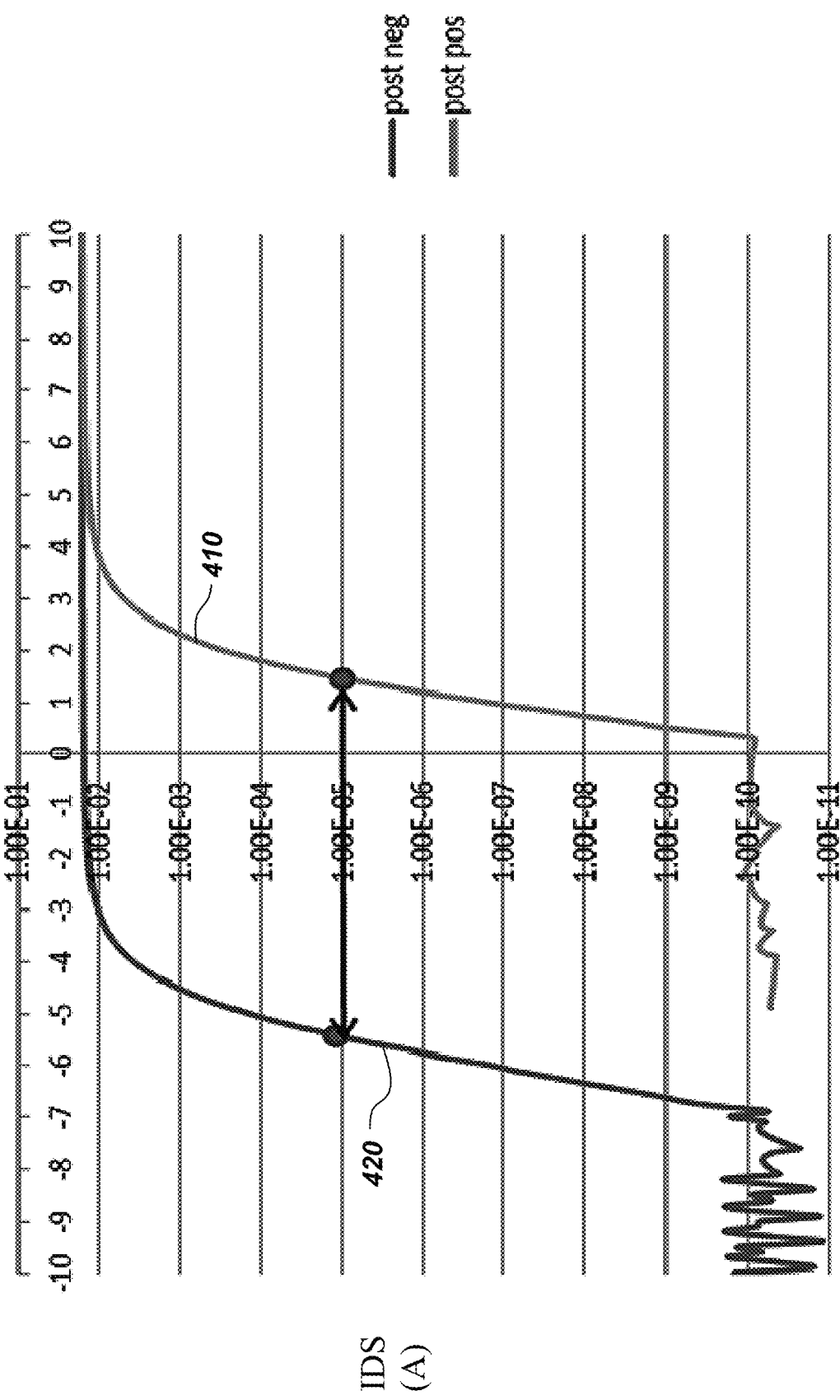
FIG. 4 is a plot of drain current as a function of gate voltage for a conventional MOSFET such as in FIG. 3, before and after voltage and temperature stressing.

FIG. 4 is a plot of drain current as a function of gate voltage for a conventional MOSFET such as in FIG. 3, before and after voltage and temperature stressing. The threshold drain current method used herein for characterizing NBTI is a variation of the "sub-threshold technique". Test conditions are such that the transfer curve measurements are taken on MOSFETs at constant stress temperature. First, the gate voltage is held at a constant −20 volts for 15 minutes and the VDS is held at zero volts. Then, a small constant voltage is applied between the source and drain terminals (e.g. 100 milli-volts) and the gate voltage is swept from −10 volts to +10 volts, a range large enough to capture the lower current range of the MOSFET (e.g. less than 0.1 nano-amps in this particular case) up to the saturation current (e.g. approximately 16 milli-amps), defining the "post neg" transfer curve 420 depicted in FIG. 4. A constant voltage gate positive stress bias of +20 volts is then applied to the gate for an additional 15 minutes, with VDS=0V. Finally, a similar reverse sweep of the gate voltage is conducted from +10 volts to −10 volts to capture the "post pos" transfer curve 410 with VDS=0.1 V.

The results in FIG. 4, demonstrates the shift in the threshold voltage (i.e., a shift in the voltage where IDS increases significantly) following positive and negative gate bias stressing. The threshold voltage shift thus represents the effects of bias temperature instability (BTI).

As shown in FIG. 4, VTH drift data is taken from an actual MOSFET without a remedial layer. The VTH drift is taken as the voltage difference between the VTH positive voltage stress value and the VTH negative voltage stress value at 10 micro-amps of source to drain current. In this example the VTH drift is approximately 6.9 volts. The vertical scale is the drain current (amps), the horizontal scale is the gate to source voltage (volts).

The use of 10 micro-amps as the threshold drain current of choice for VTH determination is done for practical reasons. For example, it is small enough to reside on the linear sub-threshold portion of the semilog transfer curve, and is large enough to measure accurately and easy to extract from the data. The MOSFET parameters and test conditions for data collection are as follows: VDS=0.1 volt; Temp=175 degrees; Celsius; gate oxide thickness (Tox)=500 Angstroms, Device Active Area=0.067 cm$^2$; Area of one MOS cell=1.6E-4 cm$^2$; channel width to length ratio (W/L) of one MOS cell=6900. Scaling the threshold drain current to larger or smaller devices has a linear dependence on Device Active Area, Area of one MOS cell and W/L. Note however, that threshold current scales inversely with gate oxide thickness (Tox). For background purposes, see for example, H. G. Lee, S. Y. Oh and G. Fuller, "A Simple and Accurate Method to Measure the Threshold Voltage of an Enhancement-Mode MOSFET", IEEE Trans. Electron Dev. ED-29, 346-348, February, 1982.

Experiments have been conducted with various metals and the remedial layer has been shown to be effective in inhibiting NBTI effects such that the change in voltage threshold is less than 1 V. In certain examples, the VTH change has been even lower and certain materials have demonstrated a VTH change of less than 500 millivolts, while some other examples have shown a VTH change of less than 300 millivolts. The types of materials and thickness of the remedial layer contribute to the behavior and effects of the remedial layer.

Referring again to FIGS. 1 and 2a, 2b, Applicants have discovered that MOSFETs that include a remedial or barrier layer, such as the remedial layer 123 in MOSFET 100, mitigate or avoid the occurrence of BTI. Specifically, Applicants have repeated the above-described voltage and temperature stress tests for MOSFETs consistent with the MOSFET 100 of FIGS. 1 and 2a, 2b, where the MOSFETs included SiC substrates, dielectric layers, aluminum source electrodes, and a remedial layer between the inter-layer dielectric and aluminum source layer. The results indicate that the proper remedial layer inhibits the BTI effects and allows for unique applications without the reliability concerns of the traditional devices.

Further experiments were conducted using other metals as the remedial layer that provides a barrier to the source metal. Based on the testing of certain alternative metals and extrapolating from the data, the following metals are believed to be suitable as a remedial layer for sufficiently inhibiting the effects of NBTI: indium (In), nickel (Ni), molybdenum (Mo), tungsten (W) titanium (Ti), gold (Au), copper (Cu), tantalum (Ta), and platinum (Pt). The metals of such metals and or alloys are also contemplated. Combinations of certain metals were tested as some metals, such as Ni, provide an adhesion layer that is beneficial when utilizing other metals. In one experiment a thin layer of Ni (10 nm) was used to enhance the adhesion properties with another metal that was used as the remedial layer. Examples of combination metals include Au—Mo and Au—Ni.

Certain experiments were conducted using a remedial layer thickness of about 0.2 micron for the following metals: Au with 10 nm Ni; Ni; Ta. The experimentation also included various thicknesses of Ti such as 20 nm and 100 nm. With respect to the remedial layer, the continuous conformal coating of the inter-layer dielectric from the Al source layer is effective at inhibiting the NBTI. It has been shown that a thickness of 20 nm is effective at inhibiting NBTI and lesser thickness should also be sufficient as long as there is a continuous conformal coating of the inter-layer dielectric to separate it from the Al source layer. Depending upon the materials used for the remedial layer, a 10 nm thickness of the remedial can be used in one embodiment. In another embodiment, a 5 nm thickness of the remedial layer can be employed.

In addition to the metal materials used as the remedial layer, one embodiment does not use metals but rather materials such as silicon dioxide ($SiO_2$), silicon nitride ($SiN_x$ or $Si_3N_4$), and polysilicon. As noted in FIG. 2b, the remedial layer in this example does not need to cover the contact layer and therefore does not have to be a conductive metal. It is believed that these materials will also sufficiently inhibit the NBTI effects.

The presence of silicon nitride or polysilicon as the remedial layer 123 is suspected to play a few roles. One role is played by both polysilicon and silicon nitride. The source electrode 124 (e.g.: Aluminum) will not be in contact with the interlayer dielectric 120 as the remedial layer 123 is inserted between the Aluminum and the ILD, so that the reaction between the ILD (e.g.: silicon dioxide) and the Aluminum will be suppressed. Silicon nitride is also a good diffusion barrier that blocks the migration of atomic hydrogen, so that any atomic hydrogen that might be generated will be blocked from moving into the active channel region by silicon nitride. Thus in one embodiment the remedial layer is placed proximal or about the ILD 120 wherein about refers to any location above, below or within the ILD 120. Therefore, even if the silicon nitride is placed below the dielectric layer 120, above the dielectric layer 120 or within the dielectric layer 120, it is expected that the beneficial effect of inhibiting NBTI will still occur. In the case of polysilicon, this material is known to contain a large number of grain boundaries and dangling silicon bonds that absorb atomic hydrogen and therefore, does not allow the atomic hydrogen to pass through it. So, as in the case of polysilicon, the remedial layer 123 could be placed below the dielectric layer 120, above the dielectric layer 120 or within the dielectric layer 120, and it is presumed that the beneficial effect of inhibiting NBTI will still occur. While FIG. 2b shows remedial layer 123 above ILD 120, however placing remedial layer 123 anywhere between the source electrode 124 and gate electrode 106 is within the scope of this system.

Figure 5:
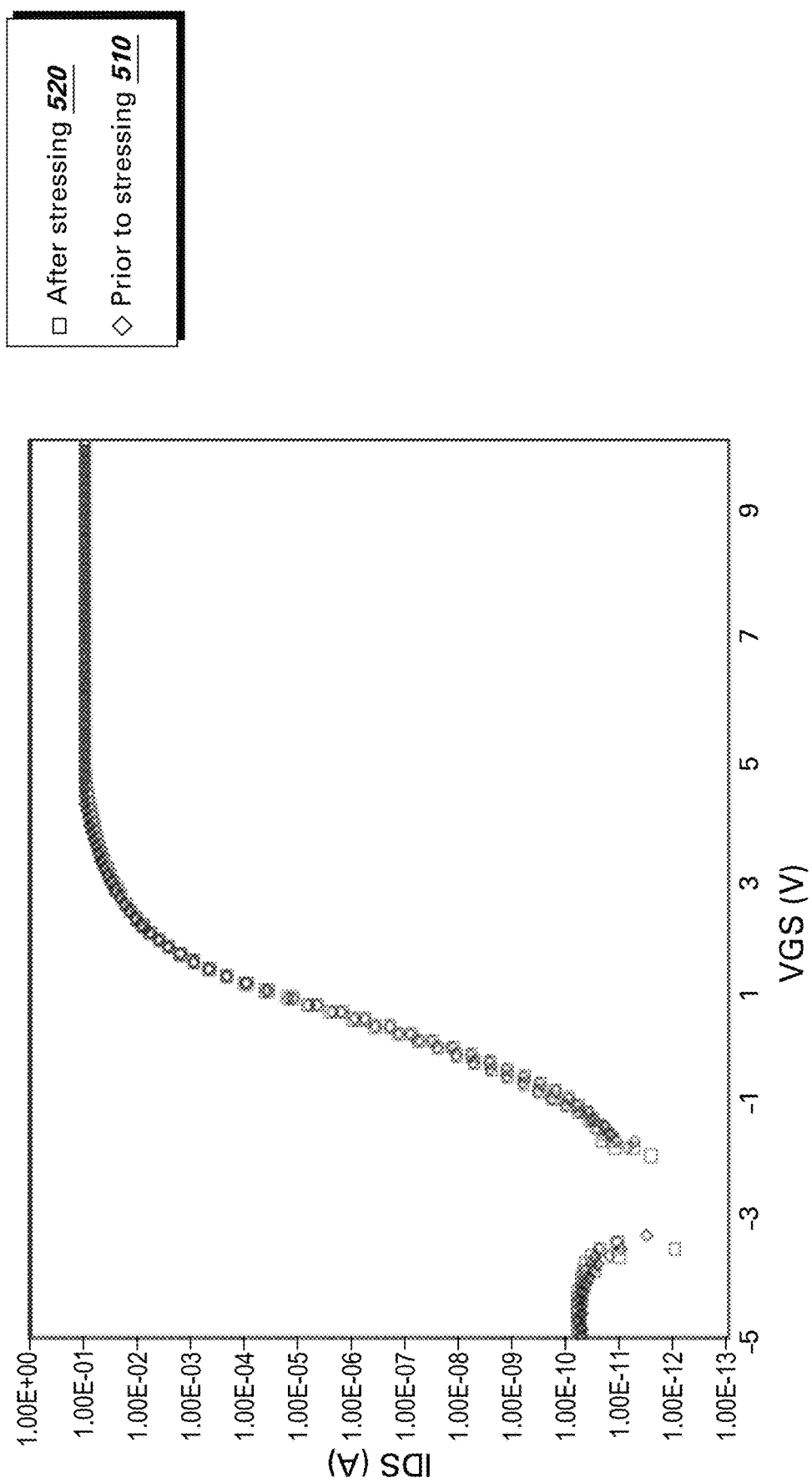
FIG. 5 is a plot of drain current as a function of gate voltage for the MOSFET of FIG. 1, including a remedial layer, before and after voltage and temperature stressing.

The results of certain tests are presented in FIG. 5 for the gate voltage (VGS) versus the output current (IDS). The testing shows the device characteristics prior to stressing 510 as well as the response after stressing 520. The two curves 510, 520 are essentially mapped on top of each other and do not demonstrate the threshold movement or NBTI effects such as illustrated in FIG. 4. These results show that MOSFETs including, for example, a remedial layer 123 having properties and characteristics detailed herein do not exhibit NBTI effects such as seen in conventional MOSFETs.

Figure 6:
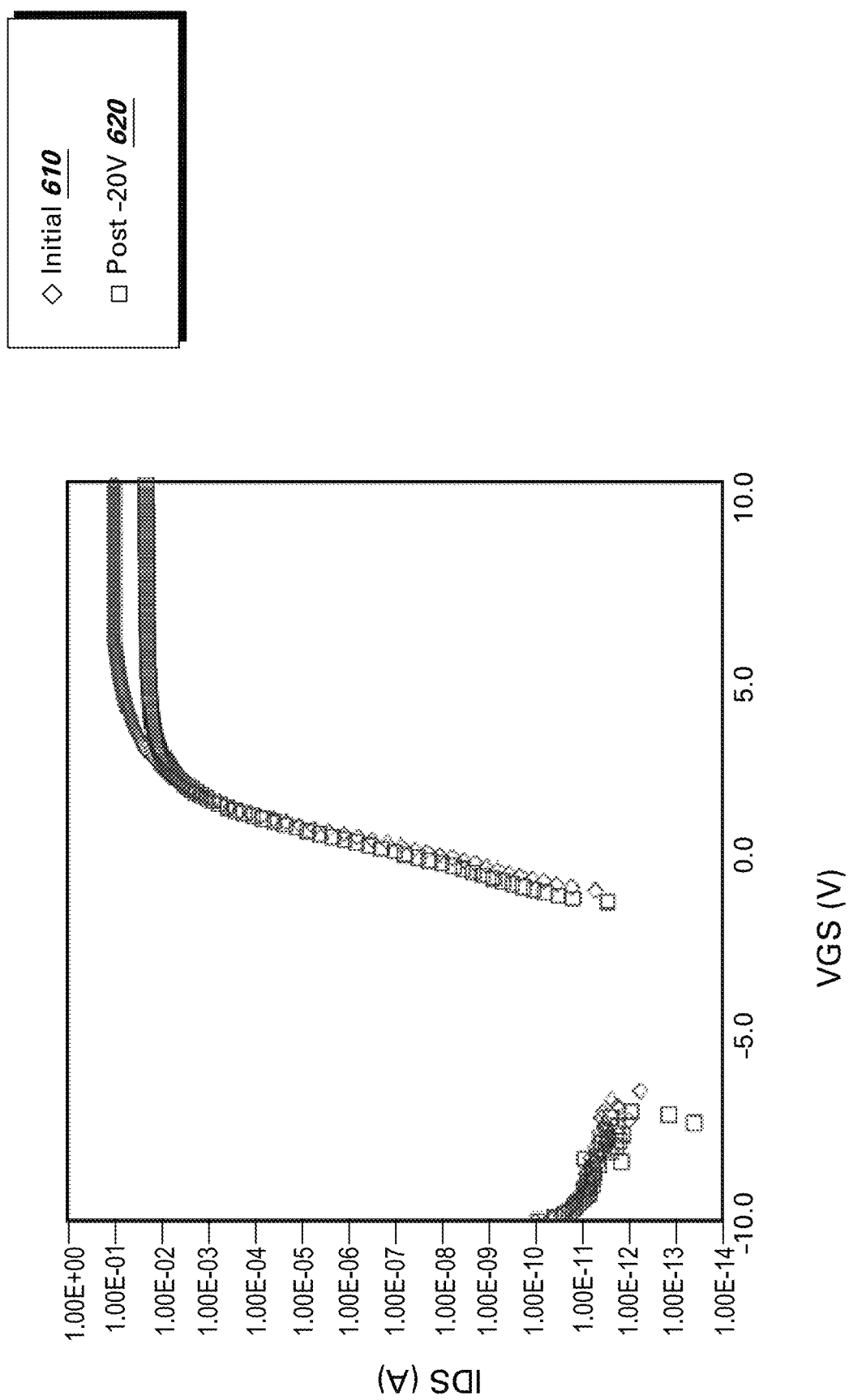
FIG. 6 is a plot of drain current as a function of gate voltage for the MOSFET of FIG. 1, including a remedial layer, before and after voltage and temperature stressing.

The MOSFETs including the remedial layer were additionally stressed for a time of 114 hours, and the results of those tests are presented in FIG. 6. The initial characteristic curve 610 illustrates the device performance prior to stressing whereas the post characteristic curve 620 shows the device performance following the post −20V stressing that was conducted for 114 hours. These results confirm that the MOSFETs including a remedial layer do not exhibit NBTI effects such as seen in conventional MOSFETs as the curves are substantially mapped on top of each other.

There are several explanations for the efficacy of the remedial layer 123 (FIGS. 1 and 2a, 2b) in inhibiting NBTI in SiC-based semiconductor devices. The physics/chemistry is complex and while the exact mechanism may not be entirely understood, the Applicants have discovered the necessary relationships and uncovered solutions to resolve the NBTI dilemma.

Figure 7:
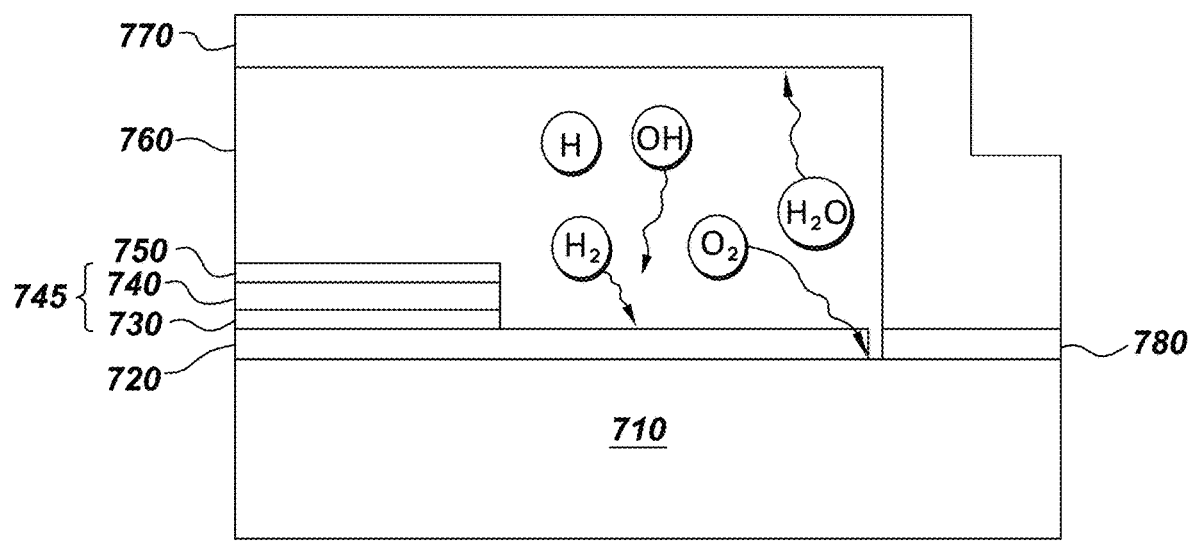
FIG. 7 is a diagrammatic depiction of a theory behind the NBTI issues.

Some explanations for the NBTI issue for SiC devices may be explained with reference to FIG. 7, which again illustrates a portion of a conventional MOSFET such as shown in FIG. 3 that excludes the remedial layer. In the illustrated embodiment, there is a SiC substrate 710 upon which an insulation layer 720 is deposited. On this insulation layer 720 the gate electrode 745 is formed. In this example the gate electrode 745 comprises a polysilicon layer 730 followed by a low resistance layer 740 such as silicide. A low temperature film (LTO) 750 is disposed upon the low resistance layer 740. The thick dielectric layer 760 such as PSG covers the gate electrode 745 and the source electrode 770 is disposed onto the dielectric layer 760.

Under typical environmental conditions, water ($H_2O$) molecules may be trapped within the MOSFET (e.g., in the dielectric layer 760 or at interfaces between different layers). It is believed according to one theory that the trapped water molecules react at the interface between the source electrode 770 and the dielectric layer 760, forming $H^+$ and $OH^-$ ions, and may also form other H-containing species (e.g., $H_2$, $H^-$). The diffusivity of hydrogen is such that it can penetrate to the channel region of the MOSFET structure under low temperature and interact with defects that exist either at the interface or in the near interface gate oxide itself. Hydrogen can react with these defects to alter their electrical nature (e.g. passivating them). Under high temperature and strong attractive fields (VGS negative), these hydrogen bonds may be broken and the hydrogen will drift away from the interface region leaving behind defects which are effective hole traps that can acquire a net positive charge from the accumulated hole population in the channel in this bias condition. Thus the VTH can shift in the negative direction as there is a net positive charge at the interface.

It is suspected that this reaction may be facilitated when the source electrode 770 is formed of aluminum (Al), with both Al and Al oxide ($Al_2O_3$) present at the interface with the dielectric layer 760. Once generated, electric fields generated by the operation of the MOSFET and enhanced at concentration points (e.g., at corners and edges of charged structures in the MOSFET) may act to ionize/further ionize the H-containing species ($H^+$, $OH^-$, $H_2$, $H^-$). At least some of the H-containing species may then diffuse to the interface between the insulation layer 720 (e.g., $SiO_2$) and the SiC substrate 710 and/or the gate electrode 745, thereby creating defects that can trap positive charges. Some of the H-containing species, as well as oxygen molecules and water molecules, may also diffuse through the source electrode 770 into the surrounding atmosphere. In any event, the excess of positive charges may remain at the interface and/or gate electrode 745 even after the large negative voltage has been removed from the gate electrode, with these charges causing a change in the threshold voltage of the MOSFET. Continuous and repeated application of the large bias can further provide a sink of positive charges at the interface between the insulation layer 720 and the SiC substrate 710 and/or at the gate electrode 745.

Considering the MOSFET 100 of FIG. 1, according to one of the theories involving NBTI, water molecules may be trapped therein, and may dissociate under temperature and voltage stress to form variously charged H-containing species. However, a remedial layer inhibits the NBTI issue. In one postulation, depending upon the device structure, the remedial layer of appropriate composition, such as Ti, may act to getter the H-containing species that are generated from the dissociating water molecules. Gettering of the H-containing species may serve to prevent the H-containing species from accumulating at the interface between the insulation layer 720 and the substrate 710 and/or at the gate electrode 734, thereby limiting any effect on the threshold voltage of the MOSFET. This may be especially important in the case of the $H^+$ ions that are further ionized by locally concentrated electric fields, which ions may be expected, based on Applicants' experimental results, to contribute significantly to NBTI in SiC devices. In another postulation, depending upon the device structure, the remedial layer serves to separate the source metal, such as Al, from the inter-layer dielectric. While the theories underlying the NBTI may not be entirely understood, the present application provides detailed techniques and structures to inhibit the NBTI effects.

Figure 8:
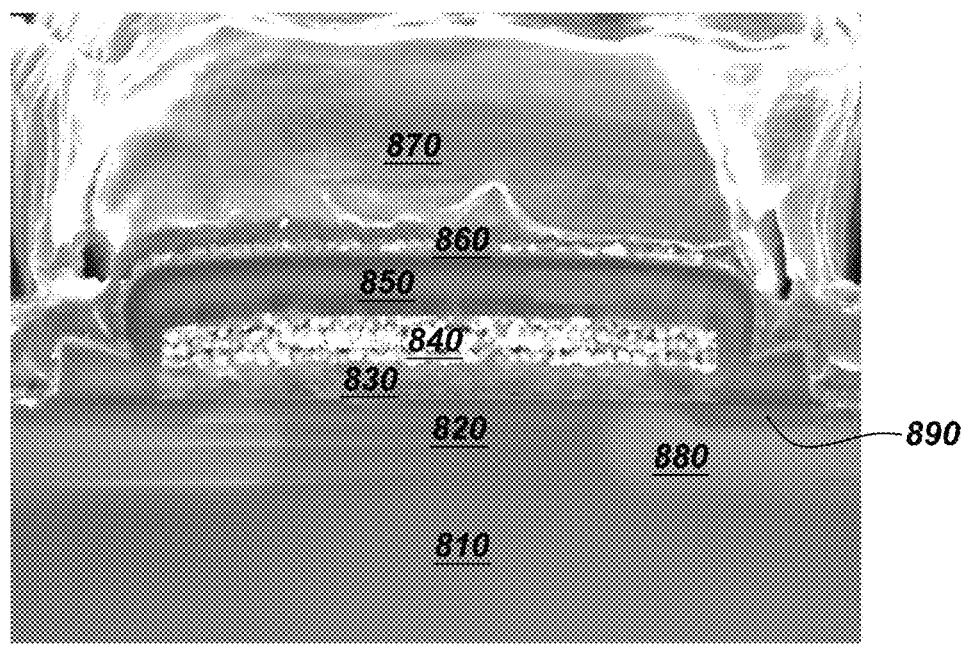
FIG. 8 is a cross sectional perspective of the actual MOSFET device illustrating the constituent elements according to one embodiment.

FIG. 8 shows a cross-sectional view of one embodiment of the MOSFET such as the MOSFET of FIG. 1. The device comprises a SiC substrate 810 with a silicon dioxide layer 820 upon which the gate electrode is deposited. The gate electrode includes the polysilicon layer 830 and the silicide layer 840. There is an inter-layer dielectric (ILD) layer 850, such as PSG, and a remedial layer 860, such as Ti, that covers the ILD. The source electrode 870, such as Al, covers the remedial layer 860 and extends to the n+ source contact region 890. The p− base (also referred to as p− well) region 880 is also visible in this cross-sectional perspective. As noted, the source layer 870 is dramatically thicker than the remedial layer 860.

The MOSFET including the remedial layer can be fabricated using standard microelectronic fabrication processes. These processes can include, for example, lithography, film deposition/growth methods (e.g., physical and chemical vapor deposition, plating, oxidation, etc.), crystal growth methods, and wet and dry etching methods.

Figure 9:
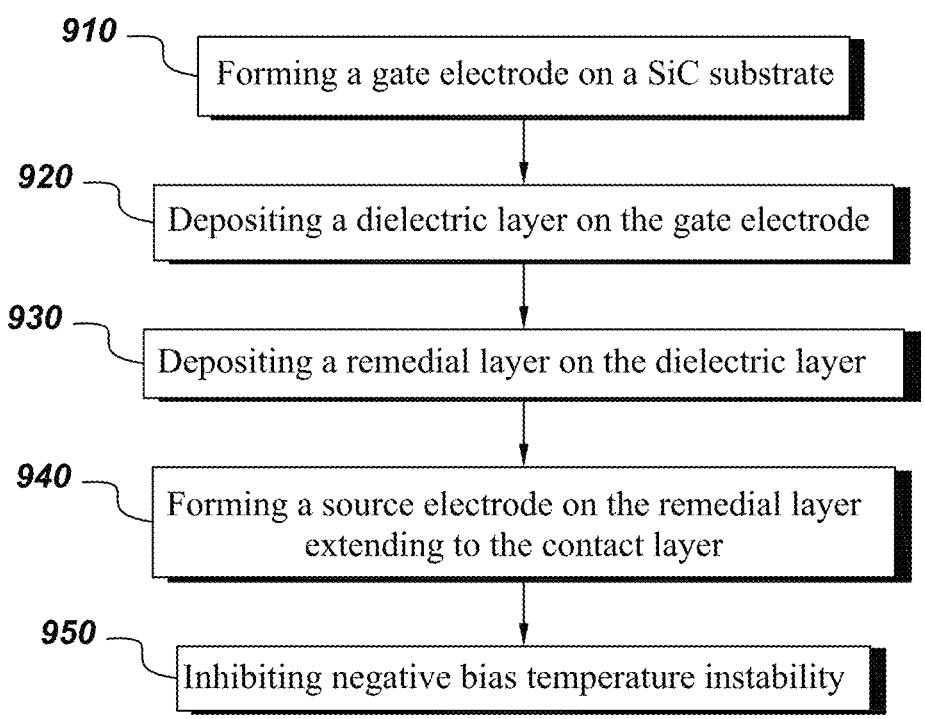
FIG. 9 is a flow chart illustrating the process steps for forming a semiconductor device with reduced negative bias temperature instability according to one embodiment.

Referring to FIG. 9, the MOSFET such as shown in FIG. 1 is fabricated and in one example is processed by providing a SiC substrate and processing according to the typical processing steps including forming a gate electrode on the SiC substrate 910. The gate electrode in one example is formed with a polysilicon layer, and a low resistance layer such as a Silicide. A dielectric layer is deposited on the gate electrode 920. A remedial layer is then deposited on the dielectric layer 930 such that the remedial layer provides continuous conformal coverage of the inter-dielectric layer. As shown in FIG. 2a, the remedial layer can extend over the contact layer if a conductive metal is employed. In another example such as shown in FIG. 2b, the remedial layer can cover the inter-dielectric layer with a continuous conformal layer but does not need to extend to the contact layer. In this latter example, the remedial layer can be a metal or another material such as polysilicon, silicon dioxide, or silicon nitride. A source electrode metal, such as aluminum, is formed over the remedial layer and extends to the contact layer 940. The usage of the remedial layer, separating the source electrode from the dielectric layer, provides for inhibiting negative bias temperature instability 950. In one example the NBTI is inhibited such that the voltage threshold (VTH) is less than 1 volt.

The devices with the remedial layer have been tested for repeatability and in various operating conditions. Certain NBTI characterization experiments have operated the MOSFET devices with the remedial layer for repeatability and stress. One of the experiments examined the temperature characteristics according to the Arrhenius activation energy. The MOSFET devices with the remedial layer were tested from about −50 to 300 degrees Celsius and demonstrated high stability. This operating temperature range is much higher than other devices and also much higher when considering the NBTI effects are inhibited. Furthermore, it is believed that higher temperature ranges are also achievable above 300 degrees Celsius.

Such high temperature operation using the designs of the present device is atypical in the semiconductor industry. In one conventional approach, there is careful consideration of materials that are close in relation to the coefficient of thermal expansion (CTE) of the semiconductor. However, one embodiment of the present design includes a large CTE mismatch in the metal-semiconductor design and yet the device operates reliably at 300 degrees Celsius. The selection of Al as the source metal also allows for superior interconnect properties.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A semiconductor device, comprising:
   a semiconductor substrate comprising silicon carbide;
   a gate electrode disposed on a surface of the semiconductor substrate;
   a dielectric layer disposed on the gate electrode and on the surface of the semiconductor substrate;
   a remedial layer comprising titanium that is conformally disposed on the dielectric layer and on the surface of the semiconductor substrate;
   a source electrode disposed on the remedial layer and electrically coupled to a source contact region of the semiconductor substrate; and
   a contact layer disposed on the surface of the semiconductor substrate and covering a portion of the source contact region, and wherein the remedial layer is disposed between and provides electrical contact between the contact layer and the source electrode.

2. The semiconductor device of claim 1, wherein the dielectric layer is disposed on the surface of the semiconductor substrate along sidewalls of the gate electrode to form sidewalls of the dielectric layer, and wherein the remedial layer is disposed on the surface of the semiconductor substrate along the sidewalls of the dielectric layer.

3. The semiconductor device of claim 1, wherein remedial layer is continuously disposed on the dielectric layer to physically isolate the source electrode from the dielectric layer to block interface trap formation and oxide charge migration between the source electrode and the dielectric layer during operation of the semiconductor device.

4. The semiconductor device of claim 1, wherein the remedial layer mitigates negative bias temperature instability such that a change in threshold voltage is in a range of between 100 millivolts to 1 volt, wherein the change in threshold voltage occurs under a gate to source voltage bias and when a drain current is about 10 microamps (μA) with a drain-source voltage (VDS) of 0.1 volts (V).

5. The semiconductor device of claim 1, wherein the remedial layer comprises at least one of indium (In), nickel (Ni), molybdenum (Mo), tungsten (W), gold (Au), copper (Cu), tantalum (Ta), platinum (Pt), and compositions thereof.

6. The semiconductor device of claim 1, wherein the remedial layer comprises at least one of silicon dioxide (SiO2), silicon nitride (SiNx), and polysilicon.

7. The semiconductor device of claim 1, wherein the source electrode comprises at least one of aluminum (Al), nickel (Ni), and combinations thereof.

8. The semiconductor device of claim 1, wherein the source electrode is disposed on a portion of the source contact region.

9. The semiconductor device of claim 1, wherein the remedial layer has a thickness of less than about 300 nanometers (nm).

10. A semiconductor device, comprising:
 a silicon carbide (SiC) substrate;
 a gate electrode disposed on a first surface of the SiC substrate comprising an insulation layer disposed on the first surface of the SiC substrate, a polycrystalline silicon layer disposed on the insulation layer, and a low resistance layer disposed on the polycrystalline silicon layer, wherein the insulation layer is silicon dioxide (SiO2) and the low resistance layer comprises at least one of a metal and a silicide;
 a dielectric layer disposed on the gate electrode;
 a source electrode disposed above the dielectric layer and electrically coupled to a source contact region of the SiC substrate; and
 a remedial layer comprising titanium disposed between the dielectric layer and the source electrode such that the dielectric layer does not contact the source electrode.

11. The semiconductor device of claim 10, wherein remedial layer is continuously and conformally disposed on the dielectric layer to physically isolate the source electrode from the dielectric layer to block interface trap formation and oxide charge migration between the source electrode and the dielectric layer during operation of the semiconductor device.

12. The semiconductor device of claim 10, wherein the remedial layer has a thickness of less than about 20 nm.

13. The semiconductor device of claim 10, wherein the remedial layer comprises an adhesion layer disposed directly on the dielectric layer.

14. The semiconductor device of claim 10, comprising:
 a contact layer disposed on the first surface of the SiC substrate and covering a portion of the source contact region; and
 a body contact region disposed adjacent to the source contact region within the first surface of the SiC substrate, wherein the contact layer substantially covers the body contact region, and wherein the source electrode is in electrical contact with the body contact region via the contact layer.

15. The semiconductor device of claim 14, wherein the source electrode is disposed on and is in direct electrical contact with the contact layer and with a second portion of the source contact region.

16. A semiconductor device, comprising:
 a silicon carbide (SiC) substrate, wherein a first surface of the SiC substrate comprises a source contact region and a body contact region;
 a contact layer disposed on the surface of the SiC substrate and covering the body contact region and a first portion of the source contact region;
 a gate electrode disposed on the surface of the SiC substrate and covering a second portion of the source contact region;
 a dielectric layer disposed on a top of the gate electrode and covering a third portion of the source contact region along sidewalls of the gate electrode;
 a remedial layer comprising titanium that is continuously and conformally disposed on a top of the dielectric layer and covering a fourth portion of the source contact region along sidewalls of the dielectric layer, wherein the remedial layer has a thickness of less than about 300 nanometers (nm);
 a source electrode comprising aluminum (Al) disposed on the remedial layer and electrically coupled to the source contact region of the SiC substrate; and
 a drain electrode disposed on a second surface of the SiC substrate opposite the first surface.

17. The semiconductor device of claim 16, wherein the source electrode is disposed on the surface of the SiC substrate and covers a fifth portion of the source contact region.

18. The semiconductor device of claim 16, wherein the semiconductor device comprises a metal-oxide field-effect transistor (MOSFET), an insulated gate bipolar transistors (IGBT), MOS controlled thyristor, or gate controlled thyristor.

* * * * *